United States Patent
Magni et al.

(10) Patent No.: US 11,901,250 B2
(45) Date of Patent: Feb. 13, 2024

(54) METHOD OF MANUFACTURING SEMICONDUCTOR DEVICES AND CORRESPONDING DEVICE

(71) Applicant: STMicroelectronics S.r.l., Agrate Brianza (IT)

(72) Inventors: Pierangelo Magni, Villasanta (IT); Michele Derai, Milan (IT)

(73) Assignee: STMicroelectron S.r.l., Agrate Brianza (IT)

( * ) Notice: Subject to any disclaimer, the term of this patent is extended or adjusted under 35 U.S.C. 154(b) by 66 days.

(21) Appl. No.: 17/411,585

(22) Filed: Aug. 25, 2021

(65) Prior Publication Data
US 2022/0068741 A1 Mar. 3, 2022

(30) Foreign Application Priority Data
Aug. 27, 2020 (IT) .......................... 102020000020566

(51) Int. Cl.
*H01L 23/495* (2006.01)
*H01L 23/31* (2006.01)
*H01L 21/56* (2006.01)
*H01L 23/18* (2006.01)
*H01L 23/498* (2006.01)

(52) U.S. Cl.
CPC ........ *H01L 23/3107* (2013.01); *H01L 21/561* (2013.01); *H01L 23/18* (2013.01); *H01L 23/49838* (2013.01)

(58) Field of Classification Search
CPC ... H01L 23/3107; H01L 21/561; H01L 23/18; H01L 23/49838
USPC ......................................................... 257/668
See application file for complete search history.

(56) References Cited

U.S. PATENT DOCUMENTS 11,145,582 B2 * 10/2021 Ziglioli ............. H01L 23/49575
2019/0115287 A1 4/2019 Derai et al.
2021/0305203 A1 * 9/2021 Graziosi ................. H01L 24/97

FOREIGN PATENT DOCUMENTS

EP 3664127 A2 12/2019
TW 201203478 A 1/2012

OTHER PUBLICATIONS

IT Search Report and Written Opinion for IT Appl. No. 102020000020566 dated May 18, 2021 (8 pages).

* cited by examiner

*Primary Examiner* — Caleb E Henry
*Assistant Examiner* — Dilinh P Nguyen
(74) *Attorney, Agent, or Firm* — Crowe & Dunlevy

(57) ABSTRACT

A semiconductor chip or die is mounted at a position on a support substrate. A light-permeable laser direct structuring (LDS) material is then molded onto the semiconductor chip positioned on the support substrate. The semiconductor chip is visible through the LDS material. Laser beam energy is directed to selected spatial locations of the LDS material to structure in the LDS material a pat gstern of structured formations corresponding to the locations of conductive lines and vias for making electrical connection to the semiconductor chip. The spatial locations of the LDS material to which laser beam energy is directed are selected as a function of the position the semiconductor chip which is visible through the LDS material, thus countering undesired effects of positioning offset of the chip on the substrate.

24 Claims, 5 Drawing Sheets

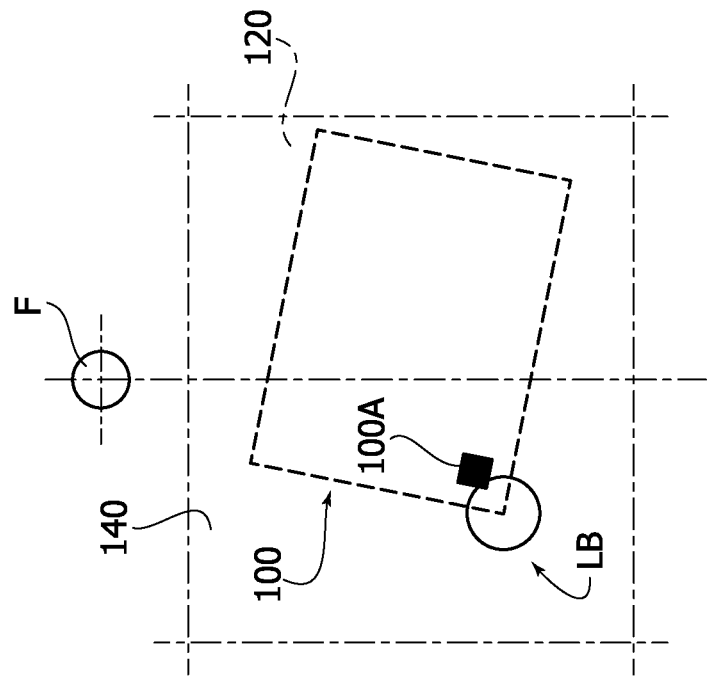
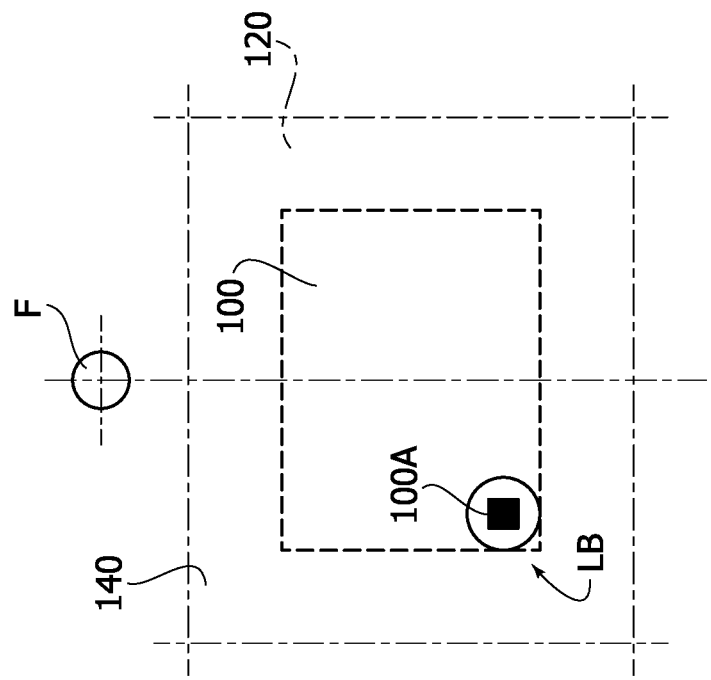

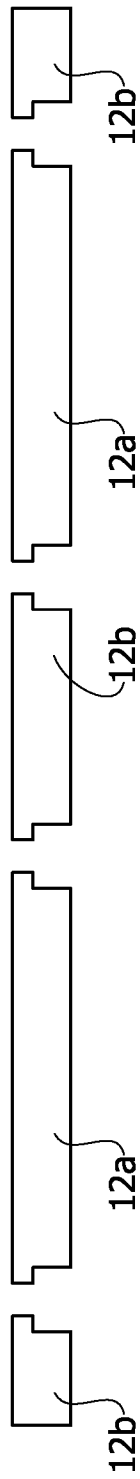
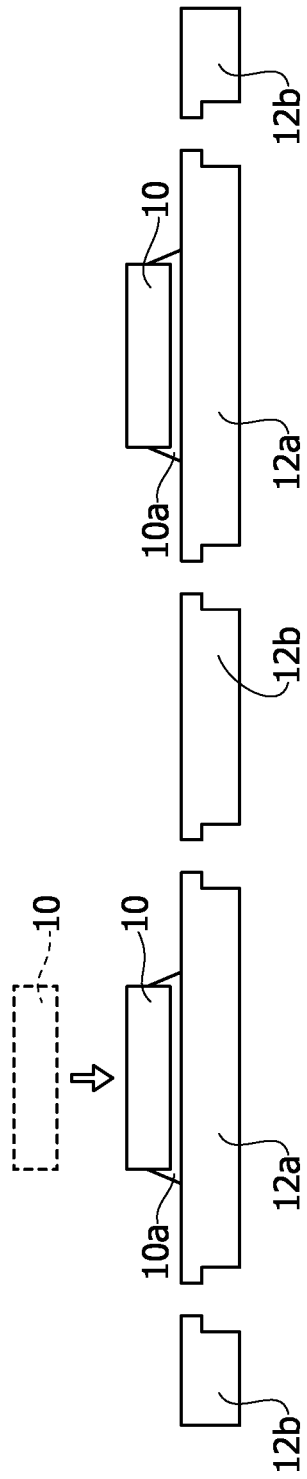
FIG. 6A
FIG. 6B

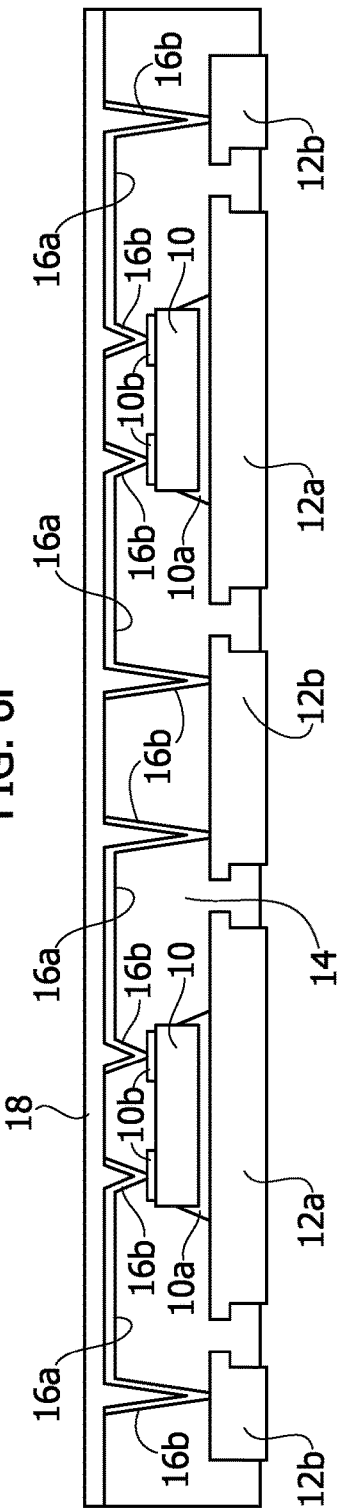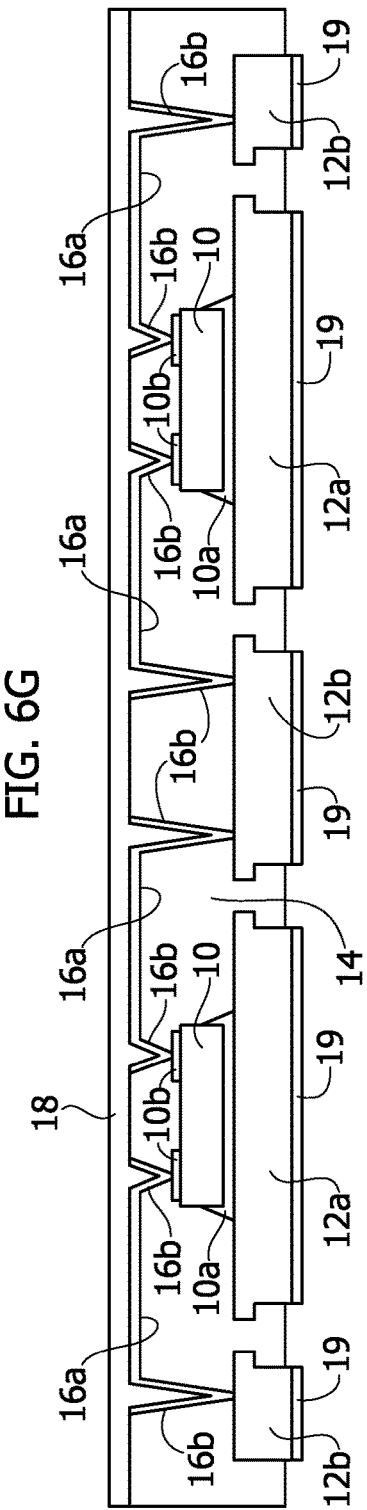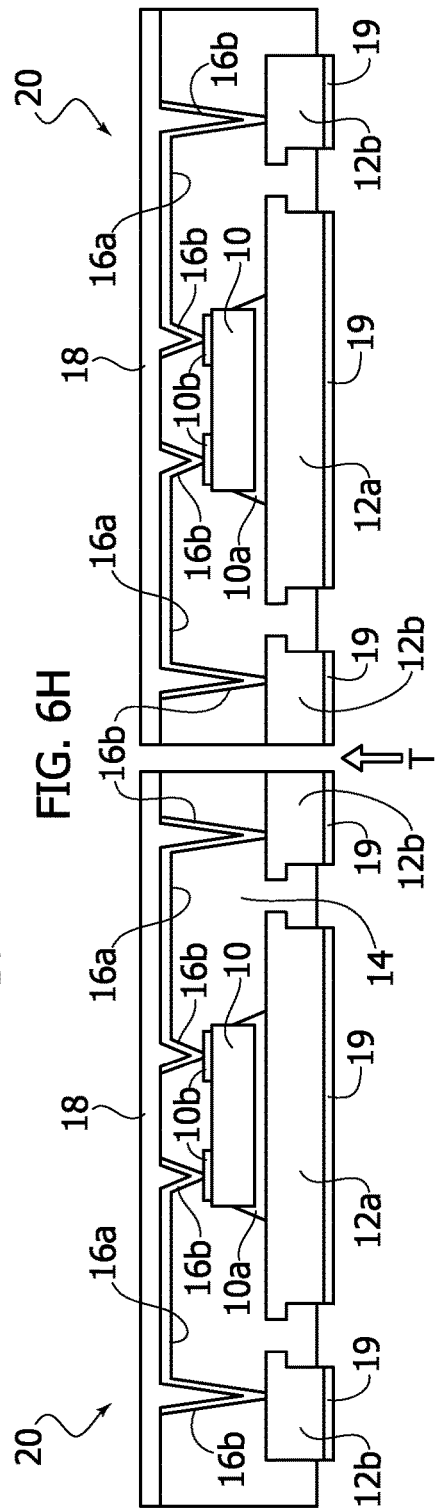

METHOD OF MANUFACTURING SEMICONDUCTOR DEVICES AND CORRESPONDING DEVICE

PRIORITY CLAIM

This application claims the priority benefit of Italian Application for Patent No. 102020000020566, filed on Aug. 27, 2020, the content of which is hereby incorporated by reference in its entirety to the maximum extent allowable by law.

TECHNICAL FIELD

The description relates to manufacturing semiconductor devices such as, for instance, integrated circuits (ICs).

BACKGROUND

The manufacturing process of integrated circuits conventionally comprises a molding step which aims at encapsulating a semiconductor device in a plastic package to protect it from the outer environment (e.g., from humidity).

For instance, an insulating compound (an epoxy molding compound, for instance) can be molded onto a leadframe or a substrate to encapsulate one or more semiconductor dice arranged thereon.

Recent developments in that area involve the possibility of using an additive molding compound including an additive material, e.g. laser direct structuring (LDS) material.

Laser direct structuring (LDS) is a laser-based machining technique now widely used in various sectors of the industrial and consumer electronics markets, for instance for high-performance antenna integration, where an antenna design can be directly formed onto a molded plastic part. In an exemplary process, the molded parts can be produced with commercially available resins which include additives suitable for the LDS process; a broad range of resins such as polymer resins like PC, PC/ABS, ABS, LCP are currently available for that purpose.

In LDS, a laser beam can be used to transfer a desired structured pattern onto a plastic molding which may then be subjected to metallization (for instance via electroless plating with copper or other metals) to finalize a desired conductive pattern.

That is, once structured formations are provided in an LDS material "activated" via laser beam energy, electrically-conductive lines or vias can be provided by forming electrically-conductive material on the structured formations. This may involve, for instance, forming a thin film by immersion into a copper (Cu) electroless bath, followed by galvanic Cu growth, this resulting in thick Cu tracks formed which connect the semiconductor die or dice and the leads.

An issue in LDS package technology lies in that the real die position is not known by the laser source, due to the mold layer above the die. This leads to a certain risk of misalignment of the structured formations with respect to the die pads with ensuing lack of electrical continuity and possible die damage during laser drilling to form vias in the LDS material.

Using a laser beam source with equipped with an integrated X-Ray system for LDS processing would give rise to very complicated and expensive machine, merging in one machine fairly different technologies.

Alternatively, fiducials can be added, on a leadframe, for instance, and precisely mapped (X, Y, theta): laser processing and die attach can be thus operatively linked, for instance by building a leadframe map (used for die attachment) which is read by the LDS laser equipment to execute its task. This again results in complex and expensive equipment integration.

Despite the activity in the area, improved solutions are desirable. There is a need in the art to contribute in providing such improved solutions.

SUMMARY

One or more embodiments may relate to a method of manufacturing semiconductor devices.

One or more embodiments may relate to a corresponding device.

In one or more embodiments, die encapsulation (molding step in the assembly flow) can be performed using a light-permeable (clear or transparent) molding compound, as available on the market, filled with LDS additive particles (Chromium (Cr) oxide or other particles) in the place of conventional LDS molding compound which is light-impermeable (black, for instance).

As illustrated herein, encapsulated die or dice can be easily localized via visual inspection (via a simple camera, for instance), which facilitates proper alignment of a LDS laser beam source as a function of the actual position in the device after die attachment.

For instance, one or more embodiments may involve molding a first transparent LDS molding compound over a die attached on a substrate (a leadframe, for instance), patterning tracks and drilling vias in the transparent LDS compound landing on bonding die pads and possibly molding a second molding compound over the assembly thus formed.

One or more embodiments may provide semiconductor devices comprising one or more integrated circuit die attached onto a substrate (a leadframe, for instance), a first transparent LDS compound molded over the integrated circuit die having tracks and vias formed in the transparent molding compound electrically connecting the die to the substrate.

BRIEF DESCRIPTION OF THE DRAWINGS

One or more embodiments will now be described, by way of example only, with reference to the annexed figures, wherein:

FIGS. 1A and 1B are exemplary of certain positioning issues which may arise in manufacturing semiconductor devices.

DETAILED DESCRIPTION

Figure 2:
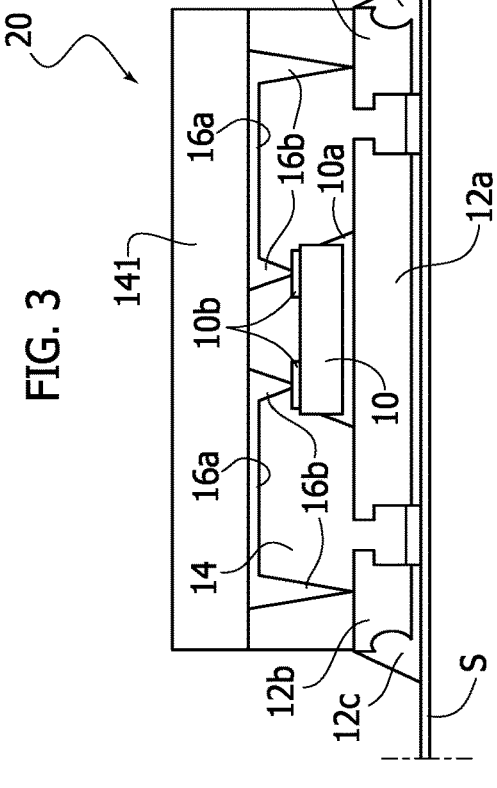
FIGS. 2 to 4 are cross-sectional views through semiconductor devices as discussed herein.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

Documents such as U.S. Patent Application Publication Nos. 2018/0342433, 2018/0342453 and 2019/0115287 (incorporated herein by reference), disclose various possibilities of applying laser direct structuring (briefly LDS) technology to packaging semiconductor devices such as integrated circuits (ICs).

For instance, LDS technology may facilitate creating interconnections between a semiconductor chip or die and leadframe leads or substrate terminals, through vias and lines, thanks to laser drilling and structuring a specific molding compound, making its paths electrically conductive.

This technology may effectively substitute for wire bonding with an additional difficulty related to possible laser processing exposed to the risk of being performed in a "blind" mode: the real die position is not known to the laser, due to the opaque encapsulating molded layer extending above the die.

As noted, this leads to a certain risk of misalignment of the structured formations with respect to the die pads with ensuing lack of electrical continuity and possible die damage during laser drilling to form vias in the LDS material.

This possible contingency is exemplified in FIGS. 1A and 1B.

Both figures can be regarded as notional (top) plan views of a semiconductor chip or die 100 (of any type known type) attached onto a substrate 120 such as a leadframe with a LDS compound 140 molded thereon to encapsulate the assembly thus formed.

The circle referenced as LB is exemplary of the area to which LDS processing laser beam energy may be applied, for instance, to drill into the compound 140 a via that extends towards a die pad 100A in the die 100.

FIG. 1A is exemplary of an ideal case where the die 100 is placed accurately (without offset) on the substrate 120 so that the laser beam LB is correctly directed towards the pad 100A on the die 100.

FIG. 1B is exemplary of a case where the die 100 may be placed with a certain offset (this is deliberately emphasized or exaggerated in the figure for ease of explanation) with respect to the ideal desired position on the substrate 120.

As a result, the laser beam LB is directed towards a position which may not correspond to the pad 100A on the die 100, which may lead to the drawbacks discussed in the foregoing.

That is, the inability for the source of the laser beam LB to recognize the real position of the die 100 encapsulated in the molding compound 140 leads to a sort blind processing which may result in a possible misalignment of laser drilled vias on die pads or other structured formations in the LDS compound.

It is noted that this drawback is not completely avoided even in the presence of "fiducials" on the leadframe 120 as indicated at F in FIG. 1B as the fiducial on the leadframe may not be indicative of the relative positioning of the die attached to the leadframe.

As discussed previously, a laser source with an integrated X-ray viewing system or, alternatively, creating a die map after die attach may represent options to consider in addressing misalignment issues as exemplified in FIG. 1B.

A laser beam source with an integrated X-ray viewing system may facilitate recognizing the die position through a standard (black, for instance) molding compound. Similarly, a die map from a die attach machine may facilitate a laser in learning a real die position offset with respect to a nominal desired position.

As discussed in the introductory portion of this description, both a laser source equipped with an X-ray viewing system and a laser source linked to a die attach machine inherently result in complex and expensive equipment, hardly attractive for use in large-scale manufacturing of semiconductor devices.

In one or more embodiments, the issue of such an undesired blind LDS processing can be addressed by noting that die encapsulation (molding step in the assembly flow) can be performed by using, in the place of standard black (opaque) molding compound, a molding compound which is light-permeable (transparent) in at least a portion of the visible range, filled with LDS additive particles (Cr oxide, for instance).

Electromagnetic radiation in the visible range (range of visible light) is electromagnetic radiation that can be perceived by the human eye. Visible light is usually defined as having wavelengths in the range of 400-700 nanometers (nm), or $4.00 \times 10^{-7}$ to $7.00 \times 10^{-7}$ m.

In that way, a conventional viewing system (a camera, for instance) can be coupled to the LDS laser beam source with the capability of recognizing (locating) the die encapsulated in the molding compound and aligning correctly the laser beam source with the real device position after attachment (also) in the presence of attach offset (see FIG. 1B).

A transparent molding compound facilitates driving the laser beam towards desired positions for processing (drawing a line or drilling a via, for instance) irrespective of a possible offset in die positioning.

A laser source equipped with standard camera, that is operating in the visible range, is capable of recognizing the position of a die through a transparent molding compound and, possibly using leadframe fiducials, to adapt the nominal drawing/drilling to the real conditions. Laser misalignment issues and possible die damages induced by too strong laser power can thus be dealt with.

As noted, a broad range of resins such as polymer resins like PC, PC/ABS, ABS, LCP are currently available for use in LDS compounds.

Clear or transparent (that is, light-permeable in the visible range) materials are otherwise known in the area of optical semiconductors, for instance from optoelectronic packages where "active" areas are involved. By way of example, CMOS cameras may include transparent a molding compound to "expose" the pixel array with a surface forming a lens on top of them. Also, certain sensors (emitter and receiver) may include some curved surfaces on transparent covers.

It was noted that certain compounds devised for use as clear molding compounds in optical semiconductors may be advantageously used (also) to provide LDS molding compounds.

Exemplary of such clear molding compounds suited to be advantageously used in embodiments include, for instance, compounds such as those available under the trade designations of NITTO NT-822 SI (NITORON T(NT) Series available from Nitto Denko Corporation of 33rd Floor, Grand Front Osaka, 4-20, Ofuka-cho, Kita-ku, Osaka 530-0011, Japan) or Kyocera XKE-5128 (available from Kyocera Corporation of 6 Takeda Tobadono-cho Fushimi-ku Kyoto-shi Kyoto 612-8501 Japan).

Such commercially available clear molding compounds are exemplary of light-permeable resins having a (uniform) refractive index around 1.5 at 589.3 nm, with a value in the range between 1 and 2 at 589.3 nm being held adequate for die recognition by a camera as desired.

One or more embodiments involve the recognition that light-permeability (transparency) of such clear molding compounds devised for use in optical semiconductor is not adversely affected by a filling of LDS activatable particles such as Cr oxide particles, for instance.

This was found to be the case for particles having a nanometer-range particle size (that is LDS particles with a particle size the order of a few nanometers) with a concentration which can be reduced to a value as low as approximately 7% (by weight) without negatively affecting the plating process which is currently used to finalize electrically-conductive formation in a LDS process.

Figure 3:
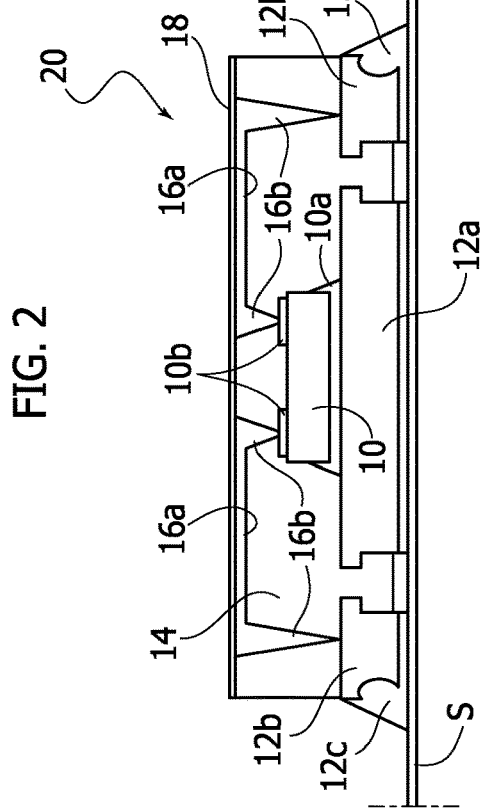
Figure 4:
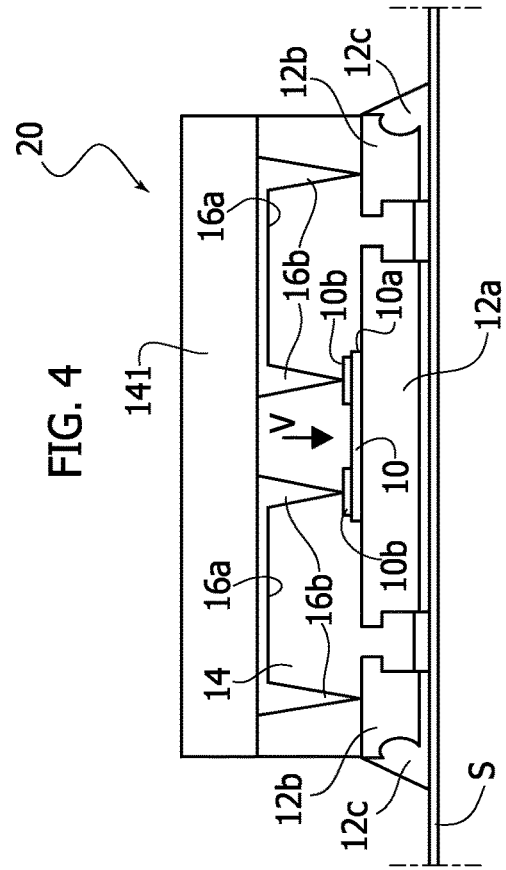

FIGS. 2 to 4 (plus FIG. 5, which is a notional view in the direction of arrow V in FIG. 4) are cross-sectional views across various semiconductor devices as exemplified herein.

For simplicity, throughout FIGS. 2 to 5 (and FIGS. 6A to 6H as well) like parts or elements are indicated with like references/numerals; for brevity, a corresponding description will not be repeated for each and every figure.

FIGS. 2 to 5 are illustrative of semiconductor devices (integrated circuits or ICs, for instance) indicated 20 as a whole.

As illustrated, the devices comprise one or more semiconductor chips or dice 10 (one chip or die is illustrated here for simplicity) attached via die attach 10a to a substrate such as a leadframe.

The designation "leadframe" (or "lead frame") is currently used (see, for instance the USPC Consolidated Glossary of the United States Patent and Trademark Office) to indicate a metal frame which provides (at a so-called die pad 12a, for instance) support for a chip or die 10 as well as an array of electrical leads 12b to interconnect the chip or die 10 electrical components or contacts.

The lead frame 12 having the chip or chips mounted thereon may in turn by supported by a second substrate S such as a printed circuit board or PCB on to which the device 20 may be mounted via electrically conductive solder or glue material 12c.

A mass of molding compound 14 can be molded onto the leadframe 12a, 12b having one or more semiconductor chips or dice 10 arranged thereon. The molding compound 14 may provide a (per se electrically insulating) protective encapsulation of the chip or die 10.

All of the foregoing may be held to be conventional in the art, which makes it unnecessary to provide a more detailed description herein.

Likewise known in the art (see, for instance, at least some of the patent documents mentioned in the foregoing) is the possibility of using laser direct structuring (LDS) material as the molding compound and applying LDS processing to such a molding material in order to provide electrically-conductive lands, traces, lines 16a over the molding compound 14 as well as vias 16b through the molding compound 14.

This facilitates providing a desired electrical contact pattern (routing) for the chip or die 10, for instance between die pads 10b at the front or top surface of the chip or die 10 and leads 12b in the leadframe.

Such a pattern can be determined in a manner known to those of skill in the art as a function of the intended use and desired performance of the resulting device.

Using LDS material for the molding material 14 makes it possible to use electrically-conductive formations 16a, 16b provided therein to replace (wholly or partly) a more conventional wire bonding pattern used to obtain a desired electrical contact pattern (routing) for the chip or die 10.

Applying LDS processing to the molding compound 14 involves applying laser beam energy to create in the compound 1 laser structured formations configured to produce a desired pattern of electrically conductive formations. For instance, this may involve forming on and/or in the laser structured formations an electrically conductive material such as copper (via electroless plating, growth processes and so on).

As repeatedly discussed in the foregoing, such laser beam processing largely benefits from being performed accurately with laser beam energy applied at desired locations (see the laser beam LB aligned with the pad 100A in FIG. 1A) with the possibility of taking into account undesired misalignment possibly resulting from die placement offset (see the laser beam LB poorly aligned with the pad 100A in FIG. 1B).

As illustrated in figures such as FIGS. 2 to 4, such an issue can be addressed using light-permeable (transparent or clear in at least a portion of the visible range) molding compounds for the molding compound 14 as discussed in the foregoing, which:

on the one hand, can be satisfactorily used as LDS materials; and on the other hand, exhibits a refractive index (for instance with a value in the range between 1 and 2—e.g. 1.5—at 589.3 nm) which is adequate for die recognition by a camera as desired and is not adversely affected by a filling of LDS activatable particles such as Cr oxide particles, for instance, with a nanometer-range particle size distributed therein in an amount (about 7%, for instance) adequate to finalize the provision of electrically-conductive formations in a LDS process.

Even without wishing to be bound to any specific theory in that respect, it was noted that such a concentration of particles will not appreciably compromise the transparency of the resulting LDS compound if the particle size is in the range of 1/50 of the pad dimensions.

In that way, LDS structuring via laser beam energy can be performed accurately as desired even in the presence of attachment offset (see FIG. 1B) using a laser beam source coupled (in manner known per se) with an otherwise standard camera which can "see" the chip or die 10 through the light-permeable (optically transparent) molding material 14.

Such processing is largely compatible with various other processing steps which may be applied in manufacturing a semiconductor device 20 as illustrated in FIGS. 2 to 4.

For instance, FIG. 2 is exemplary of the possibility of forming (in a manner known per se to those of skill in the art) a passivation layer 18 "on top" of the package, that is over the package molding material 14 having the electrically-conductive formations 16a, 16b provided over and through the material 14.

Still by way of example, FIG. 3 is exemplary of the possibility of molding (again in a manner known per se to those of skill in the art) over the material 14 and the formations 16a, 16b further package molding material 141 of a standard type (light impermeable, black for instance). In certain embodiments, this may be helpful in shielding the chip or die 10 from light.

FIG. 4 is exemplary of the possibility of providing such a shielding effect of the chip or die 10 (in addition or as an alternative to providing the further package molding material 141) via half-etched die pad sidewalls.

These are not directly visible in the view of FIG. 4 due to scale factors. The notional plan view of FIG. 5 (arrow V in FIG. 5) illustrates the possibility for the chip or die 10 to be arranged at a half etched portion 121a of the die pad 12a surrounded by die pad sidewalls 121b.

FIGS. 6A to 6H are illustrative of a possible sequence of steps which may be involved in manufacturing semiconductor products 20 as discussed herein.

Here again, throughout FIGS. 6A to 6H, parts or elements like parts or elements already discussed in connection with the previous figures are indicated with like references/numerals; for brevity, a corresponding description of these parts or elements will not be repeated.

Figure 6C:
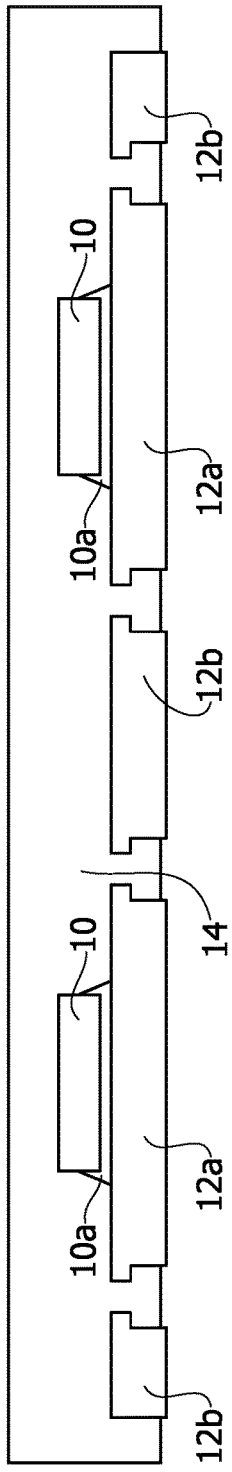

Also, FIGS. 6A to 6H are exemplary of concurrently processing plural devices 20 which, as otherwise conventional in the art, are intended to be separated in a "singulation" step as illustrated in FIG. 6H As known to those of skill in the art, a sequence as illustrated in FIGS. 6A to 6H may include certain additional steps which are not visible in the figures for simplicity and ease of understanding.

Likewise, in one or more embodiments, certain steps illustrated therein may be omitted (for instance metallization of laser structured formations provided by laser processing of LDS material) and/or replaced by other steps and/or performed in a sequence different from the sequence illustrated herein by way of non-limiting example and/or performed differently from the combinations here illustrated.

Figure 5:
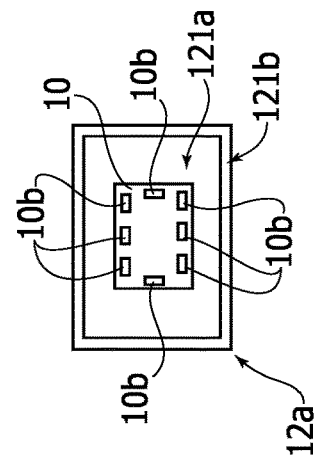
FIG. 5 is partial plan view of a portion of FIG. 4 as indicated by arrow V in FIG. 4, and FIGS. 6A to 6H are exemplary of a possible sequence of steps in a method of manufacturing semiconductor devices as discussed herein.

For instance, while illustrated in FIG. 4 in combination with a second molding step for the package molding material 141, a half-etched leadframe as illustrated in FIG. 5 can be used independently, for instance with a passivation layer 18 as illustrated in FIG. 2.

FIGS. 6A to 6H herein are illustrative of an exemplary sequence comprising the steps listed in the following.

FIG. 6A shows provision of leadframe 12a, 12b (standard or half-etched as illustrated in FIG. 5).

FIG. 6B shows attachment of chips or dice 10 at leadframe die pads, for instance via standard adhesive dispensing plus die attach, with dice possibly shielded by a half-etched die pad.

FIG. 6C shows provision of an LDS compound 14 including additive particles such as Cr oxide particles being molded onto the dice 10 attached onto the leadframe 12a, 12b; this may occur via compression molding as conventional in the art.

Figure 6D:
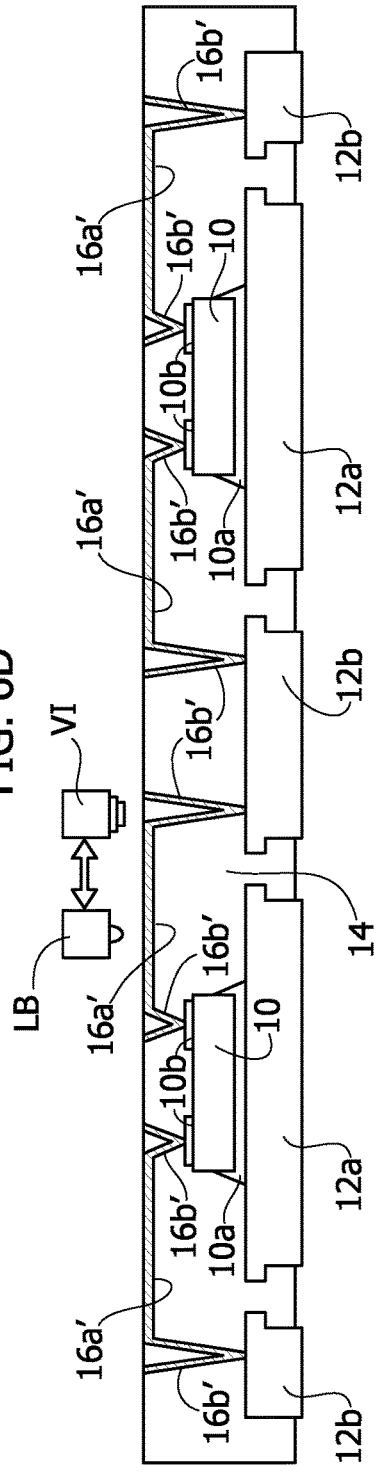

FIG. 6D shows a laser machining of LDS compound 14 to form therein structured formations 16a' (lines) and 16b' (vias); such machining can involve a conventional laser beam source LS guided (in a manner known per se to those of skill in the art) by an associated visual inspection apparatus VI (a standard high-definition camera, for instance) capable of "seeing" the dice 10 through the material 14, which—despite the presence of LDS additive particles such as Cr-oxide particles therein—is optically transparent, in at least a portion of the visible range) so that the visual inspection apparatus VI operating in the visible range is capable of accurately determining the die positions irrespective of a possible attachment offset (see FIG. 1B).

Figure 6E:
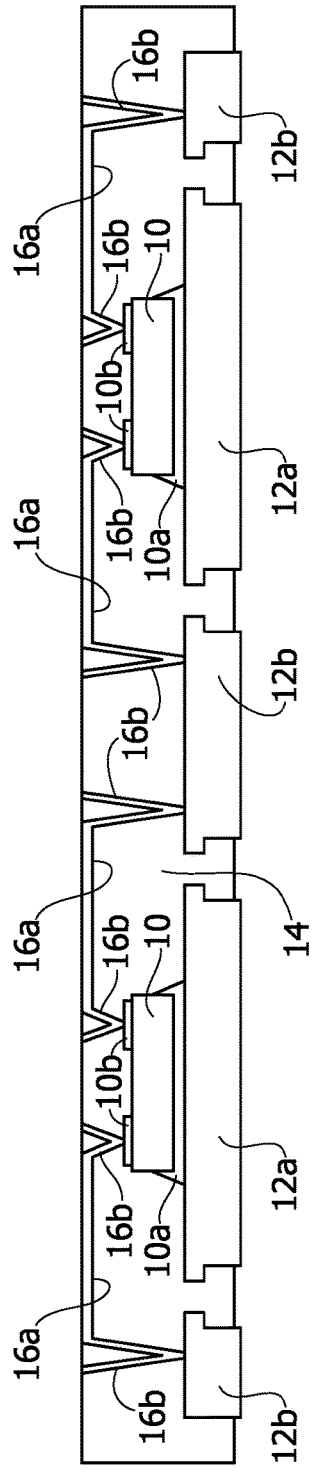

FIG. 6E shows a metallization (via copper (Cu) plating, for instance) of structured formations 16a', 16b' to finalize formation of lines 16a and vias 16b.

FIG. 6F shows a deposition of a passivation layer 18 (as illustrated in FIG. 2) and/or second step molding 141 (as illustrated in FIGS. 3 and 4—this is not visible in FIGS. 6F to 6H for simplicity).

FIG. 6G shows a tin plating on the back side of the leadframe 12a, 12b as exemplified at 19 to facilitate mounting on substrate S.

FIG. 6H shows a singulation at locations T to provide individual devices 20.

Figures such as FIG. 6D show that a transparent molding compound 14 facilitates driving the laser processing (drilling of vias, for instance) as a function of the real die position. An (otherwise conventional) laser source LB equipped with a standard camera VI is capable of recognizing die positions through the transparent molding compound 14. The possible presence of leadframe fiducials (not visible in FIG. 6D: reference can be had to F in FIGS. 1A and 1B by way of example) facilitates adapting the "drawing" action of the laser beam LB to the real conditions.

This is advantageous in countering undesired effects of laser misalignment, including possible die damages induced by too strong laser power.

In one or more embodiments, the location of the pads of a die, for instance, can be determined with adequate accuracy to correctly guide the laser beam, also in a multiple array of devices where die placement accuracy could be half of the pad dimension.

The possibility will also exist of looking at different eye-points as a reference if the optical quality response is not good on the first alignment point(s) considered.

As discussed, in one or more embodiments on top of the transparent compound 14 (200 microns thickness, for instance) a standard black (resin layer 141; 500 micron thickness) can be provided in order to protect the device 10 from light.

A method as exemplified herein may comprise: positioning (for instance, via die attach material, 10a) at least one semiconductor chip (for instance, 10) at a position (for instance 12a) on a support substrate (for instance a leadframe, 12a, 12b); molding light-permeable laser direct structuring (LDS) material (for instance, LDS material light-permeable over at least a portion of the visible range as exemplified at 14) onto the at least one semiconductor chip positioned on the support substrate, wherein the least one semiconductor chip is visible (optically visible, possibly as a result of both transparency and molding thickness) through the (light-permeable) LDS material; and directing laser beam energy (for instance, LB) to selected spatial locations of the LDS material to structure (see, for instance, 16a', 16b' in FIG. 6D) in the LDS material a pattern of electrically-conductive formations (see, for instance, 16a, 16b) for the at least one semiconductor chip, wherein said spatial locations of the LDS material are selected as a function of the position the least one semiconductor chip visible (for instance, via an optical camera VI operating in the visible range as example in FIG. 6D) through the LDS material.

A method as exemplified herein may comprise providing at least one fiducial mark (for instance, F) on said substrate wherein said spatial locations of the LDS material are selected as a function of the position the least one semiconductor chip visible through the LDS material and said at least one fiducial mark on said substrate.

A method as exemplified herein may comprise forming electrically-conductive material (for instance, plated Cu) at said selected spatial locations of the LDS material to finalize said pattern of electrically-conductive formations for the at least one semiconductor chip.

In a method as exemplified herein, the LDS material may comprise clear molding compound (that is, optically transparent in at least one portion of the visible range) filled with particles.

In a method as exemplified herein, the clear molding compound may have a refractive index between 1 and 2 at 589.3 nm, optionally about 1.5 at 589.3 nm.

In a method as exemplified said particles in the LDS material may comprise: particles having an average particle size in the nanometer range (that is, a particle size measurable in nanometer units); and/or a filling of about 7% by weight of particles in the LDS material.

In a method as exemplified herein, said particles in the LDS material may comprise Cr-oxide particles.

In a method as exemplified herein, directing laser beam energy to selected spatial locations of the LDS material may comprise: scanning (steering) a laser beam over the surface in the LDS material (to form lines, tracks or lands, for instance); and/or drilling a cavity into the LDS material (to form vias, for instance).

A method as exemplified herein may comprise at least one of: forming a passivation layer (for instance, 19) over the LDS material molded onto the at least one semiconductor chip positioned on the support substrate and having said pattern of electrically-conductive formations (for instance, 16a, 16b) thereon; and/or molding light-impermeable package material (for instance, 141) onto the LDS material molded onto the at least one semiconductor chip positioned on the support substrate and having said pattern of electrically-conductive formations thereon; and/or providing at said position on a support substrate a recessed portion (see, for instance, the half-etched portion 121a) and positioning said at least one semiconductor chip at said recessed portion in said support substrate.

A semiconductor device as exemplified herein (for instance, 20) may comprise: at least one semiconductor chip (for instance, 10) at a position (for instance, 12a) on a support substrate (for instance, 12a, 12b); a light-permeable laser direct structuring, LDS material (for instance, 14) molded onto the at least one semiconductor chip positioned on the support substrate; wherein the least one semiconductor chip is visible (by visual inspection in the visible range) through the (light-permeable) LDS material; and a pattern of electrically-conductive formations (for instance, 16a, 16b) for the at least one semiconductor chip, said formations laser-beam structured (these are discernible as such also in the final device) at selected spatial locations of the LDS material, said spatial locations of the LDS material referenced (with repeated accuracy) to the position the least one semiconductor chip visible through the LDS material.

A semiconductor device as exemplified herein may comprise at least one of: a passivation layer (for instance, 19) over the LDS material molded onto the at least one semiconductor chip positioned on the support substrate and having said pattern of electrically-conductive formations thereon; and/or light-impermeable package material (for instance, 141) molded onto the LDS material molded onto the at least one semiconductor chip positioned on the support substrate and having said pattern of electrically-conductive formations thereon; and/or a recessed portion (see, for instance, the half-etched portion 121a) at said position on a support substrate, wherein said at least one semiconductor chip is positioned at said recessed portion in said support substrate.

Without prejudice to the underlying principles, the details and embodiments may vary, even significantly, with respect to what has been described by way of example only, without departing from the extent of protection.

For instance, while the detailed description provided herein refers for simplicity to the use of Cr-oxide particles in a light-permeable LDS molding compound, one or more embodiments may equally use different types of particles such as $MnO_2$ particles within the framework of a process as disclosed in Italian Patent application No. 102020000012922, corresponding to PCT/IB2021/054304, both of which are incorporated herein by reference.

The claims are an integral part of the technical teaching provided herein in respect of the embodiments.

The extent of protection is determined by the annexed claims.

The invention claimed is:

1. A method, comprising:
   positioning at least one semiconductor chip at a position on a support substrate;
   molding a light-permeable laser direct structuring (LDS) material onto the at least one semiconductor chip positioned on the support substrate, wherein the least one semiconductor chip is visible through the light-permeable LDS material;
   directing laser beam energy to selected spatial locations of the light-permeable LDS material to structure in the light-permeable LDS material a pattern of structured formations, wherein said selected spatial locations of the light-permeable LDS material are selected in response to determining the position of the least one semiconductor chip visible through the light-permeable LDS material; and
   adding electrically-conductive material to the structured formations to produce electrically-conductive formations for making electrical connection to the at least one semiconductor chip.

2. The method of claim 1, comprising providing at least one fiducial mark on said substrate, and wherein said selected spatial locations of the light-permeable LDS material are selected in response to determining the position of the least one semiconductor chip and said at least one fiducial mark on said substrate.

3. The method of claim 1, wherein the electrically-conductive formations comprises lines and vias for making electrical connection to the at least one semiconductor chip.

4. The method of claim 1, wherein the light-permeable LDS material comprises clear molding compound filled with LDS additive particles.

5. The method of claim 4, wherein the clear molding compound has refractive index between 1 and 2 at 589.3 nm.

6. The method of claim 4, wherein said LDS additive particles comprise particles having an average particle size in a nanometer range.

7. The method of claim 4, wherein said LDS additive particles comprise particles providing a filling of about 7% by weight of particles in the light-permeable LDS material.

8. The method of claim 4, wherein said LDS additive particles comprise Cr-oxide particles.

9. The method of claim 1, wherein directing laser beam energy to selected spatial locations of the light-permeable LDS material comprises scanning a laser beam over a surface in the light-permeable LDS material at each selected spatial location where a conductive line is to be formed.

10. The method of claim 1, wherein directing laser beam energy to selected spatial locations of the light-permeable LDS material comprises drilling a cavity into the light-permeable LDS material at each selected spatial location where a conductive via is to be formed.

11. The method of claim 1, further comprising forming a passivation layer over the light-permeable LDS material molded onto the at least one semiconductor chip positioned on the support substrate and having said pattern of electrically-conductive formations thereon.

12. The method of claim 1, further comprising molding light-impermeable package material onto the light-permeable LDS material molded onto the at least one semiconductor chip positioned on the support substrate and having said pattern of electrically-conductive formations thereon.

13. The method of claim 1, further comprising providing at said position on a support substrate a recessed portion and positioning said at least one semiconductor chip at said recessed portion in said support substrate.

14. The method of claim 1, wherein positioning the at least one semiconductor chip on the support substrate comprises positioning two semiconductor chips on the support substrate, wherein molding the light-permeable LDS material is provided over the two semiconductor chips, wherein directing laser beam energy comprises directing laser beam energy to structure a pattern of structured formations over each semiconductor chip, wherein adding electrically-conductive material comprises adding electrically-conductive material to the structured formations form each semiconductor chip, and further comprising singulating between the two semiconductor chips to provide individual devices.

15. A method, comprising:
encapsulating a semiconductor chip within a light-permeable laser direct structuring (LDS) material, wherein the semiconductor chip is visible through the light-permeable LDS material;
directing laser beam energy to selected spatial locations of the light-permeable LDS material to structure in the light-permeable LDS material a pattern of structured formations, wherein said selected spatial locations of the light-permeable LDS material are selected in response to determining a position of the semiconductor chip visible through the light-permeable LDS material; and
adding electrically-conductive material to the structured formation to produce electrically-conductive formations for making electrical connection to the semiconductor chip.

16. The method of claim 15, comprising providing a fiducial mark, and wherein said selected spatial locations are selected in response to determining the position of the semiconductor chip and said fiducial mark.

17. The method of claim 16, wherein the semiconductor chip is mounted to a substrate and the fiducial mark is present on the substrate.

18. The method of claim 15, wherein the electrically-conductive formations comprises lines and vias for making electrical connection to the at least one semiconductor chip.

19. The method of claim 15, wherein the light-permeable LDS material comprises clear molding compound refractive index between 1 and 2 that includes LDS additive particles.

20. The method of claim 19, wherein said LDS additive particles comprise particles having an average particle size in a nonometer range.

21. The method of claim 19, wherein said LDS additive particles comprise Cr-oxide particles.

22. The method of claim 15, wherein directing laser beam energy to selected spatial locations of the light-permeable LDS material comprises:
scanning a laser beam over a surface in the light-permeable LDS material where a conductive line is to be formed; and
laser drilling a cavity into the light-permeable LDS material where a conductive via is to be formed.

23. The method of claim 15, further comprising forming a passivation layer over the encapsulating light-permeable LDS material.

24. The method of claim 15, further comprising molding light-impermeable package material over the encapsulating light-permeable LDS material.

* * * * *